US012700828B2

(12) United States Patent
Goto et al.

(10) Patent No.: US 12,700,828 B2
(45) Date of Patent: Aug. 4, 2026

(54) ENERGY HARVESTING DEVICE AND ENERGY HARVESTING SYSTEM

(71) Applicant: GCE INSTITUTE INC., Tokyo (JP)

(72) Inventors: Hiroshi Goto, Tokyo (JP); Minoru Sakata, Tokyo (JP); Takuo Yasuda, Tokyo (JP); Lars Mattias Andersson, Tokyo (JP); Seiji Okada, Tokyo (JP); Takahiro Nakamura, Tokyo (JP)

(73) Assignee: ILLUMINUS INC., Tokyo (JP)

( * ) Notice: Subject to any disclaimer, the term of this patent is extended or adjusted under 35 U.S.C. 154(b) by 0 days.

(21) Appl. No.: 18/690,854

(22) PCT Filed: Sep. 9, 2022

(86) PCT No.: PCT/JP2022/033829
§ 371 (c)(1),
(2) Date: Mar. 11, 2024

(87) PCT Pub. No.: WO2023/038101
PCT Pub. Date: Mar. 16, 2023

(65) Prior Publication Data
US 2025/0141402 A1 May 1, 2025

(30) Foreign Application Priority Data

Sep. 10, 2021 (JP) ................................. 2021-147809
Sep. 16, 2021 (JP) ................................. 2021-151269

(51) Int. Cl.
*H02S 40/44* (2014.01)
*H02N 11/00* (2006.01)
(Continued)

(52) U.S. Cl.
CPC ........... *H02S 40/44* (2014.12); *H02N 11/002* (2013.01); *H10N 10/13* (2023.02); *H10N 10/17* (2023.02); *H10N 15/00* (2023.02)

(58) Field of Classification Search
CPC ...... H02S 40/44; H02N 11/002; H10N 10/13; H10N 10/17; H10N 15/00
See application file for complete search history.

(56) References Cited

U.S. PATENT DOCUMENTS

2003/0221717 A1    12/2003  Dessel
2011/0048489 A1*    3/2011  Gabriel .................. H10N 10/13
                                                           438/54
(Continued)

FOREIGN PATENT DOCUMENTS

CN          103344350 A      10/2013
CN          110305635 A      10/2019
(Continued)

OTHER PUBLICATIONS

International Search Report issued in corresponding International Application No. PCT/JP2022/033829, dated Nov. 29, 2022, with translation (5 pages).

(Continued)

*Primary Examiner* — Michael Y Sun
(74) *Attorney, Agent, or Firm* — Osha Bergman Watanabe & Burton LLP

(57) ABSTRACT

An energy harvesting device configured to convert thermal energy into electrical energy includes a heat storage portion configured to store thermal energy, a thermoelectric element configured to eliminate a temperature difference between electrodes when converting thermal energy into electrical energy, and an insulating portion in contact with the heat storage portion and the thermoelectric element. The heat storage portion has insulating properties. The thermoelectric element includes a pair of electrodes having work functions different from each other, and an intermediate portion provided between the pair of electrodes. The thermoelectric (Continued)

element is provided in contact with the heat storage portion and is covered by the insulating portion.

9 Claims, 9 Drawing Sheets

(51) Int. Cl.

| | |
|---|---|
| *H10N 10/13* | (2023.01) |
| *H10N 10/17* | (2023.01) |
| *H10N 15/00* | (2023.01) |

(56) References Cited

U.S. PATENT DOCUMENTS

| | | | |
|---|---|---|---|
| 2019/0148616 A1 | 5/2019 | Nakagawa et al. | |
| 2020/0028049 A1* | 1/2020 | Hussein | H10N 10/82 |
| 2020/0266659 A1* | 8/2020 | Ueda | H02J 3/12 |
| 2021/0050801 A1 | 2/2021 | Jones et al. | |
| 2021/0399190 A1 | 12/2021 | Birmingham | |
| 2024/0373751 A1* | 11/2024 | Yin | H10N 10/01 |

FOREIGN PATENT DOCUMENTS

| | | | |
|---|---|---|---|
| EP | 1946341 | B1 | 12/2012 |
| JP | 2014053635 | A | 3/2014 |
| JP | 2015075371 | A | 4/2015 |
| JP | 2017069372 | A | 4/2017 |
| JP | 2020-047632 | A | 3/2020 |
| JP | 2020145303 | A | 9/2020 |
| JP | 6845521 | B1 | 3/2021 |
| JP | 2021077803 | A | 5/2021 |
| WO | 2021030489 | A2 | 2/2021 |

OTHER PUBLICATIONS

Written Opinion issued in corresponding International Application No. PCT/JP2022/033829, dated Nov. 29, 2022 (4 pages).
Extended European Search Report issued in corresponding European Patent Application No. 22867422.2 mailed Sep. 12, 2025 (9 pages).
Extended European Search Report issued in corresponding European Patent Application No. 22867430.5 mailed Sep. 8, 2025 (8 pages).
Office Action issued in related Canadian Patent Application No. 3231334, dated Mar. 27, 2025 (3 pages).

* cited by examiner

POWER

THERMOELECTRIC ELEMENT

SOLAR CELL PANEL

TEMPERATURE

ENERGY HARVESTING DEVICE AND ENERGY HARVESTING SYSTEM

TECHNICAL FIELD

The present invention relates to an energy harvesting device and an energy harvesting system that convert thermal energy into electrical energy.

BACKGROUND ART

As a power generation device utilizing a combination of a heat storage material and a thermoelectric element, for example, the thermoelectric conversion system disclosed in Patent Document 1 has been proposed.

The thermoelectric conversion system of Patent Document 1 includes a sheet-like thermoelectric conversion device that can perform thermoelectric conversion when one end is heated, and a fixing tool that fixes the one end.

CITATION LIST

Patent Literature

Patent Document 1: JP 2017-69372 A

SUMMARY OF INVENTION

Technical Problem

When the heat storage material is provided only at one end of the thermoelectric element as in Patent Document 1, heat generated from the heat storage material may be released to the outside without being transferred to the thermoelectric element. As a result, a decrease in the power generation amount of the thermoelectric element is a concern.

The present invention has been made in view of the above-described problem, and it is an object of the present invention to provide an energy harvesting device and an energy harvesting system that are capable of increasing a power generation amount of a thermoelectric element.

Solution to Problem

An energy harvesting device according to a first invention is an energy harvesting device that converts thermal energy into electrical energy, the energy harvesting device including a heat storage portion that stores thermal energy, a thermoelectric element that eliminates a temperature difference between electrodes when converting thermal energy into electrical energy, and an insulating portion in contact with the heat storage portion and the thermoelectric element, in which the heat storage portion has insulating properties, the thermoelectric element includes a pair of electrodes having work functions different from each other and an intermediate portion provided between the pair of electrodes, and the thermoelectric element is provided in contact with the heat storage portion and is covered by the insulating portion.

An energy harvesting device according to a second invention is the energy harvesting device according to the first invention, further including a heat conduction portion in contact with the heat storage portion and the thermoelectric element and being covered by the insulating portion.

An energy harvesting device according to a third invention is the energy harvesting device according to the first invention, in which the heat storage portion includes a sensible heat storage material.

An energy harvesting device according to a fourth invention is the energy harvesting device according to the third invention, in which the heat storage portion includes an aerogel.

An energy harvesting device according to a fifth invention is the energy harvesting device according to any one of the first to fourth inventions, in which a specific heat of the heat storage portion is larger than a specific heat of the insulating portion.

An energy harvesting device according to a sixth invention is the energy harvesting device according to the first invention, further including a solar cell panel that converts light energy into electrical energy, in which the thermoelectric element is sandwiched between a back surface of the solar cell panel and the heat storage portion.

An energy harvesting device according to a seventh invention is the energy harvesting device according to the sixth invention, further including a heat conduction portion provided in contact with the solar cell panel, the heat storage portion, and the thermoelectric element.

An energy harvesting system according to an eighth invention includes the energy harvesting device according to any one of the first to seventh inventions, a solar cell panel configured to convert light energy into electrical energy, and a power generation amount measurement unit configured to measure power generation amounts of the thermoelectric element and the solar cell panel.

An energy harvesting system according to a ninth invention is the energy harvesting system according to the eighth invention, further including a power measurement unit configured to measure power of the thermoelectric element and an estimation unit configured to estimate power generated from the solar cell panel based on a measurement result of the power measurement unit.

Advantageous Effects of Invention

According to the first to ninth inventions, the thermoelectric element is provided in contact with the heat storage portion and is covered by the insulating portion. Thus, heat generated from the heat storage portion can be easily transferred to the thermoelectric element. As a result, a power generation amount of the thermoelectric element can be increased.

In particular, according to the second invention, the heat conduction portion is in contact with the heat storage portion and the thermoelectric element and is covered by the insulating portion. Thus, the heat generated from the heat storage portion can be easily transferred to the thermoelectric element via the heat conduction portion. As a result, the power generation amount of the thermoelectric element can be further increased.

In particular, according to the third invention, the heat storage portion includes the sensible heat storage material. Thus, as compared with a latent heat storage material, the temperature range during use can be widened. With this configuration, energy harvesting suited to various applications is possible.

In particular, according to the fifth invention, the specific heat of the heat storage portion is larger than the specific heat of the insulating portion. Thus, a state can be maintained in which the heat generated from the heat storage portion is not easily released to the outside via the insulating portion. As a result, the power generation amount of the thermoelectric element can be further increased.

In particular, according to the sixth invention, the thermoelectric element is sandwiched between the back surface of the solar cell panel and the heat storage portion. Thus, heat generated from the solar cell panel in addition to the heat storage portion can be transferred to the thermoelectric element. As a result, the power generation amount of the thermoelectric element can be further increased.

In particular, according to the seventh invention, the heat conduction portion is provided in contact with the solar cell panel, the heat storage portion, and the thermoelectric element. Thus, the heat generated from the solar cell panel can be easily transferred to the heat storage portion and the thermoelectric element. In addition, the heat generated from the heat storage portion can be easily transferred to the thermoelectric element via the heat conduction portion. As a result, the power generation amount of the thermoelectric element can be further increased.

In particular, according to the eighth invention, the power generation amount measurement unit measures the power generation amounts of the thermoelectric element and the solar cell panel. Thus, instability of the power generation amount in the solar cell panel can be compensated by the power generation amount of the thermoelectric element. As a result, a variation in the power generation amount over time can be suppressed.

In particular, according to the ninth invention, the estimation unit estimates the power generated from the solar cell based on the measurement result of the power measurement unit. Thus, a variation in the power generation amount caused by the temperature of the solar cell panel can be easily estimated. As a result, the power generation amount of the entire energy harvesting device can be further increased.

DESCRIPTION OF EMBODIMENTS

Figure 1:
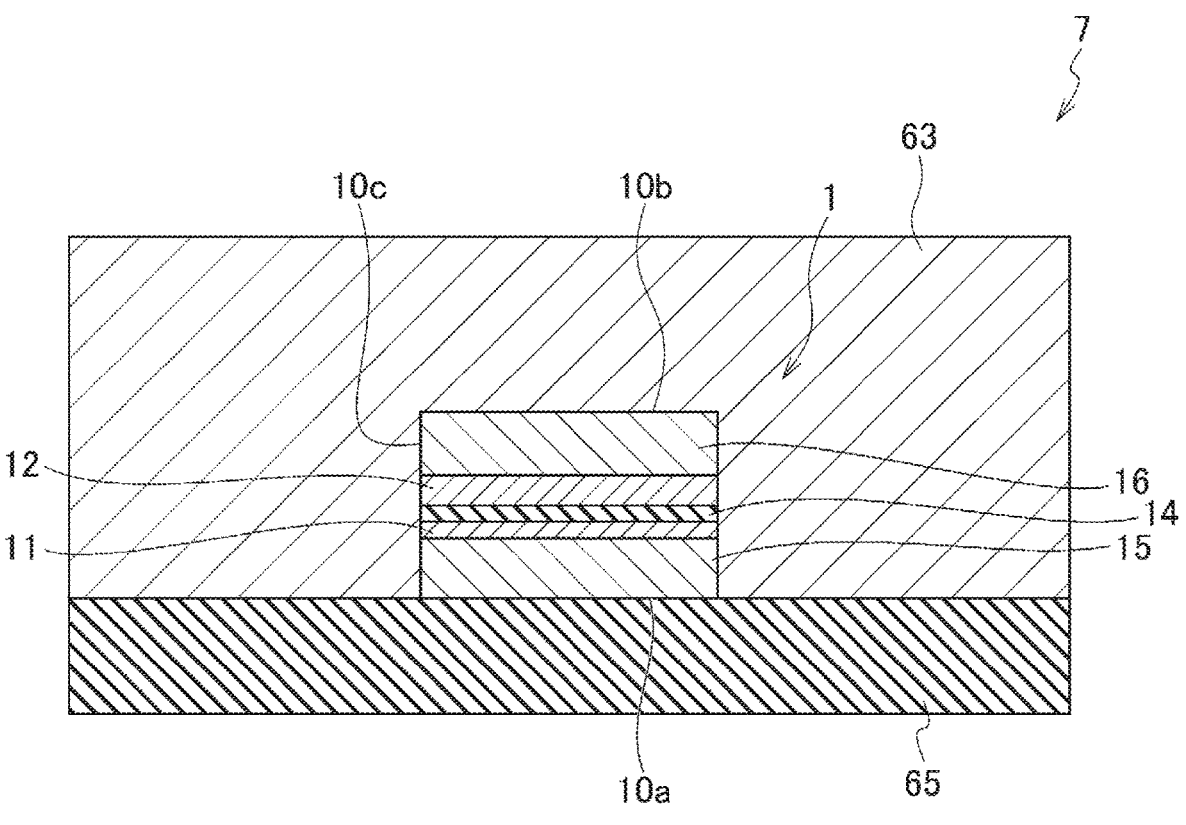
FIG. 1 is a schematic cross-sectional view illustrating an example of an energy harvesting device according to a first embodiment.
Figure 1:
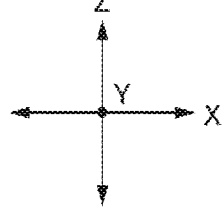

Hereinafter, an example of an energy harvesting device and an energy harvesting system as an embodiment of the present invention will be described with reference to the drawings. In each drawing, a height direction in which electrodes are layered is referred to as a first direction Z, one planar direction intersecting, i.e., orthogonal to the first direction Z is referred to as a second direction X, and another planar direction intersecting, i.e., orthogonal to both the first direction Z and the second direction X is referred to as a third direction Y. In addition, the components in each drawing are schematically illustrated to facilitate description. For example, the size of each component or ratios of sizes between components may be different from those in the drawings.

First Embodiment: Energy Harvesting Device 7

FIG. 1 is a schematic cross-sectional view illustrating an example of an energy harvesting device 7 according to a first embodiment. The energy harvesting device 7 converts thermal energy into electrical energy. The energy harvesting device 7 outputs power to a load via wiring (not illustrated). The load is, for example, an electrical device. The load is driven by, for example, using the energy harvesting device 7 as a main power supply or an auxiliary power supply. The energy harvesting device 7 can be provided inside a mobile device or a self-contained sensor terminal such as an Internet of things (IoT) device or a wearable device, and can be used as an alternative to or an auxiliary of a battery. The energy harvesting device 7 can also be applied to a larger power generation device such as that for solar power generation.

The energy harvesting device 7 includes a thermoelectric element 1 that eliminates a temperature difference between electrodes when converting thermal energy into electrical energy, a heat storage portion 65 that stores thermal energy, and an insulating portion 63 in contact with the heat storage portion 65 and the thermoelectric element 1.

Thermoelectric Element 1

As illustrated in FIG. 1, the thermoelectric element 1 includes a pair of electrodes (a first electrode 11 and a second electrode 12) having different work functions, and an intermediate portion 14 provided between the pair of electrodes 11 and 12. The thermoelectric element 1 may include at least one of a first substrate 15 and a second substrate 16. The thermoelectric element 1 converts thermal energy generated by the heat storage portion 65 into electrical energy to generate an electric current, for example.

The thermoelectric element 1 is provided in contact with the heat storage portion 65 and is covered by the insulating portion 63. In the thermoelectric element 1, for example, a surface of the first substrate 15 opposite to a surface facing the first electrode 11 constitutes a first main surface 10a, a surface of the second substrate 16 opposite to a surface facing the second electrode 12 constitutes a second main surface 10b, and a surface connecting the first main surface 10a and the second main surface 10b to each other constitutes a side surface 10c. In the thermoelectric element 1, the first main surface 10a is provided in contact with the heat storage portion 65, for example.

Insulating Portion 63

The insulating portion 63 has insulating properties. The insulating portion 63 helps prevent deterioration of the thermoelectric element 1 caused by an external environment. Providing the insulating portion 63 in contact with the heat storage portion 65 helps prevent heat generated from the heat storage portion 65 from being released to the outside.

As the insulating portion 63, a material capable of protecting the thermoelectric element 1 from the external environment is used. For example, a known material having insulating properties, such as a resin, is used. As the insulating portion 63, a material having low thermal conductivity is used, for example. The material having low thermal conductivity refers to a material having thermal conductivity of 10 W/(m·k) or less measured in accordance with ASTM E1530, for example. Examples of the material having low thermal conductivity include resins such as polyurethane, polyimide, styrene, and vinyl chloride, in addition to ceramics, tiles, and earthenware. Further, the insulating portion 63 may be constituted by a plurality of layers of members made of different materials.

Heat Storage Portion 65

The heat storage portion 65 has heat storage properties. The heat storage portion 65 includes a sensible heat storage material utilizing a specific heat (an amount of heat required to increase a temperature of a substance by a unit temperature) of a substance.

For example, when the heat storage portion 65 includes the sensible heat storage material, the specific heat of the heat storage portion 65 is higher than a specific heat of each of the substrates 15 and 16. Thus, the heat stored in the heat storage portion 65 can be easily transferred to the electrodes 11 and 12 of the thermoelectric element 1. For example, the specific heat of the heat storage portion 65 is higher than a specific heat of a support portion 62. Thus, the heat storage portion 65 can store heat for a longer period of time than the support portion 62.

As the sensible heat storage material, an aerogel or brick is used, for example. The aerogel has a nano-size porosity smaller than the mean free path of air molecules, and is made of silica, carbon, or alumina as a material. As the sensible heat storage material, for example, a material having a specific heat higher than the specific heat of glass (e.g., 0.67 J/g·K at 10° C. to 50° C.) is used. For the value of the specific heat, a literature value may be used or a measurement result according to JIS K 7123 may be used.

The heat storage portion 65 may include a latent heat storage material utilizing transition heat (latent heat) associated with phase change or transition of a substance. As the latent heat storage material, a known material utilizing phase conversion, such as water or sodium chloride, is used. The heat storage portion may include a chemical heat storage material utilizing endothermic heat generation during a chemical reaction. As the chemical heat storage material, a known material is used, for example.

The specific heat of the heat storage portion 65 is larger than the specific heat of the insulating portion 63.

Now, each component will be described in detail.

Thermoelectric Element 1

Figure 2:
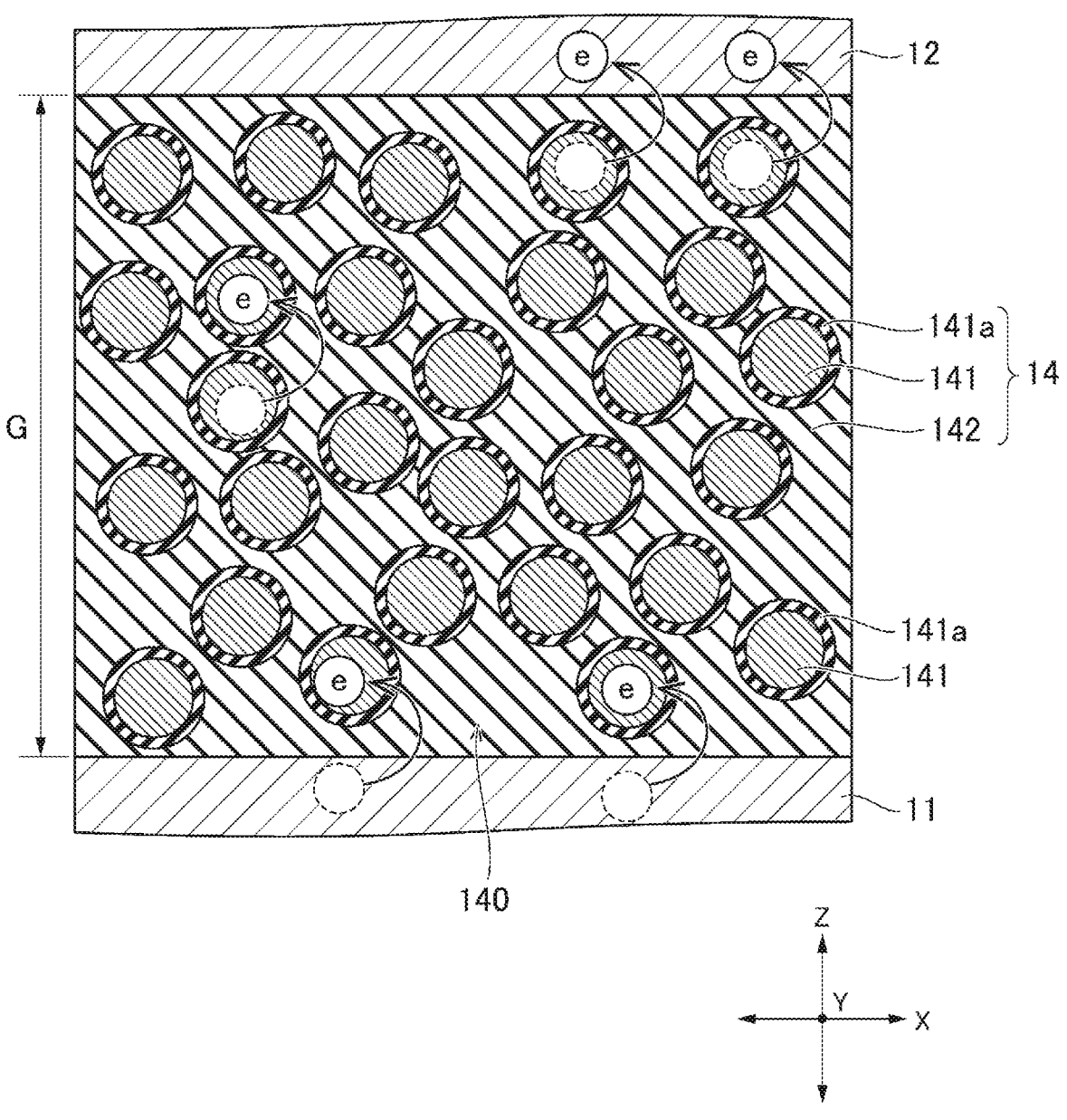
FIG. 2 is a schematic cross-sectional view illustrating an example of an intermediate portion.
Figure 6:
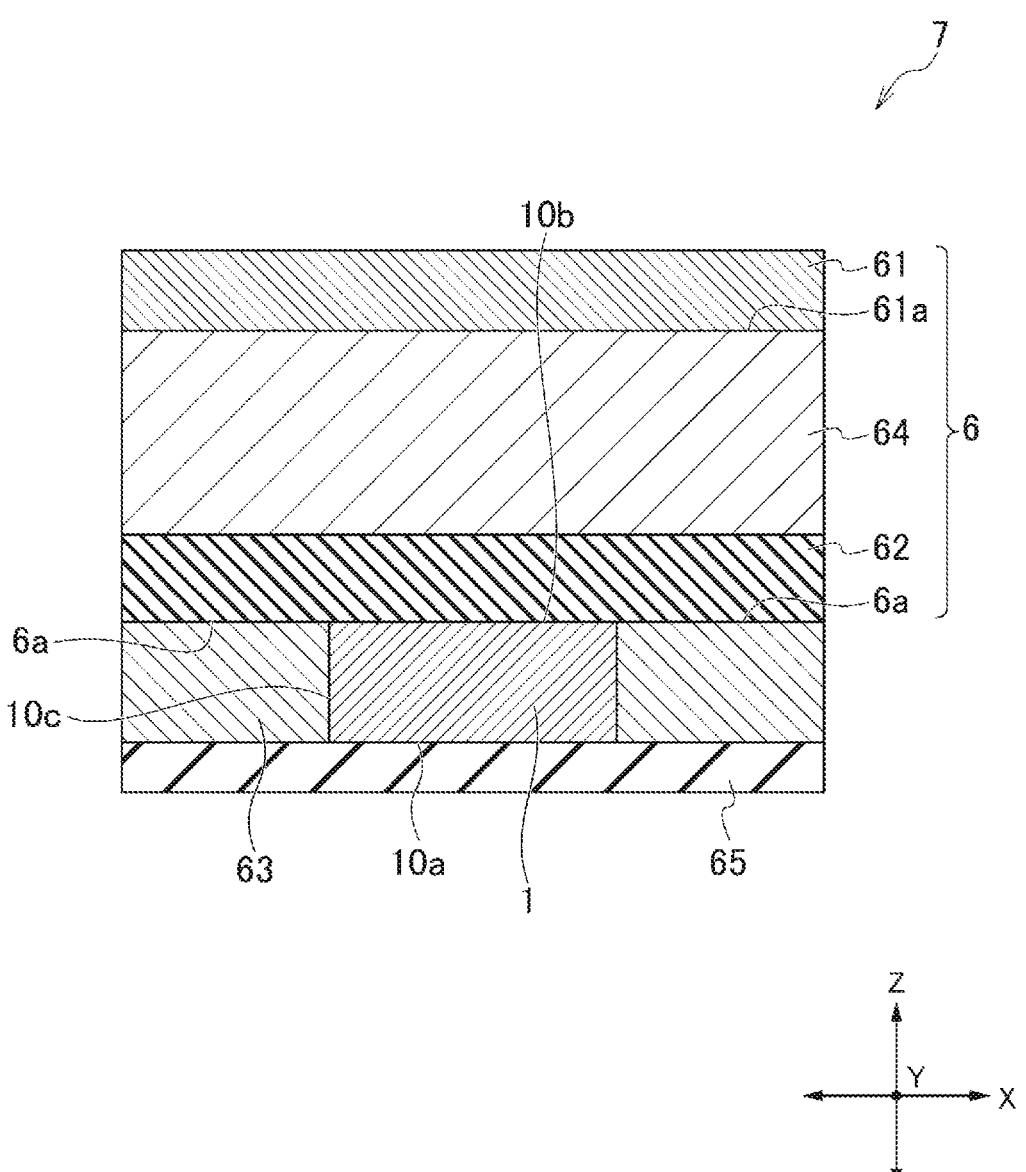
FIG. 6 is a schematic cross-sectional view illustrating an example of an energy harvesting device according to a third embodiment.

FIG. 2 is a schematic cross-sectional view illustrating an example of the intermediate portion 14. The first electrode 11 and the second electrode 12 are provided facing each other. The first electrode 11 and the second electrode 12 have different work functions. For example, as illustrated in FIG. 6, the intermediate portion 14 is provided in a space 140 including a gap (gap G) between the first electrode 11 and the second electrode 12.

The intermediate portion 14 includes nanoparticles 141 and a solid insulating layer 142. The nanoparticles 141 are fixed in a dispersed state in the insulating layer 142. In this case, movement of the nanoparticles 141 in the gap G is suppressed. This can help prevent the nanoparticles 141 from becoming unevenly distributed at one of the electrodes 11 and 12 over time and help prevent a decrease in the amount of electron movement. As a result, the power generation amount can be stabilized.

The intermediate portion 14 is provided on the first electrode 11. The second electrode 12 is provided on the insulating layer 142. In the thermoelectric element 1 that eliminates a temperature difference between electrodes when converting thermal energy into electrical energy, the power generation amount can be increased by suppressing a variation in the gap G in a plane along the second direction X and the third direction Y. Thus, when a liquid such as a solvent is used as the intermediate portion, a support portion or the like for maintaining the gap G needs to be provided. However, there is a concern that the variation in the gap G may increase once the support portion or the like is formed. In the thermoelectric element 1 according to the present embodiment, since the second electrode 12 is provided on the insulating layer 142, the support portion or the like for maintaining the gap G need not be provided. Thus, a variation in the gap caused by formation accuracy of the support portion or the like can be eliminated. As a result, the power generation amount can be increased.

First Electrode 11 and Second Electrode 12

As illustrated in FIG. 1, for example, the first electrode 11 and the second electrode 12 are separated from each other in the first direction Z. Each of the electrodes 11 and 12 extends in the second direction X and the third direction Y, for example, and a plurality of each of the electrodes may be provided. For example, one second electrode 12 may be provided facing a plurality of the first electrodes 11 at different positions, respectively. In addition, for example, one first electrode 11 may be provided facing a plurality of the second electrodes 12 at different positions, respectively.

Materials having conductivity are used as the materials of the first electrode 11 and the second electrode 12. For example, materials having different work functions are used as the materials of the first electrode 11 and the second electrode 12. Note that the same material may be used for the electrodes 11 and 12. In this case, the electrodes 11 and 12 need only have different work functions.

As the material of each of the electrodes 11 and 12, a metal conductive material made of, for example, a single element such as iron, aluminum, or copper may be used. In addition, a metal conductive material made of, for example, an alloy of two or more elements may be used. As the material of each of the electrodes 11 and 12, for example, a non-metal conductive material may be used. Examples of the non-metal conductive material include silicon (Si: e.g., p-type Si or n-type Si) and a carbon-based material such as graphene.

The thickness of each of the first electrode 11 and the second electrode 12 along the first direction Z is 4 nm or more and 1 μm or less, for example. The thickness of each of the first electrode 11 and the second electrode 12 along the first direction Z may be, for example, 4 nm or more and 50 nm or less.

The gap G indicating the distance between the first electrode 11 and the second electrode 12 can be set as desired by changing the thickness of the insulating layer 142. Since an electric field generated between the electrodes 11 and 12 can be increased by narrowing the gap G, for example, the power generation amount of the thermoelectric element 1 can be increased. Further, the thickness of the thermoelectric element 1 along the first direction Z can be reduced by narrowing the gap G, for example.

The gap G has a finite value of, for example, 500 μm or less. The gap G is, for example, 10 nm or more and 1 μm or less. For example, when the gap G is 200 nm or less, the power generation amount may decrease due to the variation in the gap G in the plane along the second direction X and the third direction Y. When the gap G is larger than 1 μm, the electric field generated between the electrodes 11 and 12 may be weakened. Thus, the gap G is preferably larger than the 200 nm and 1 μm or less.

Intermediate Portion 14

The intermediate portion 14 extends as a flat surface along the second direction X and the third direction Y. The intermediate portion 14 is provided in the space 140 formed between the electrodes 11 and 12. The intermediate portion 14 may be in contact with the main surfaces of the electrodes 11 and 12 that face each other, or may be in contact with the side surfaces of the electrodes 11 and 12, for example.

The nanoparticles 141 may be dispersed in the insulating layer 142 and some of the nanoparticles 141 may be exposed from the insulating layer 142, for example. The particle size of the nanoparticle 141 is smaller than the gap G, for example. The particle size of the nanoparticle 141 is a finite value of ⅓ or less of the gap G, for example. Setting the particle size of the nanoparticle 141 to ⅓ or less of the gap G makes it easier to form the intermediate portion 14 including the nanoparticles 141 in the space 140. As a result, workability can be improved when the thermoelectric element 1 is produced.

Here, the term "nanoparticles" means including a plurality of particles. The nanoparticles 141 include particles each having a particle size of 2 nm or more and 100 nm or less, for example. The nanoparticles 141 may include particles each having a median size (D50) of 3 nm or more and 150 nm or less, or may include particles each having an average particle size of 3 nm or more and 150 nm or less, for example. The median size or average particle size can be measured by using, for example, a particle size distribution measuring instrument. As the particle size distribution measuring instrument, for example, a particle size distribution measuring instrument using a dynamic light scattering method (e.g., Zetasizer Ultra manufactured by Malvern Panalytical) may be used.

The nanoparticles 141 contain, for example, a conductive material, and any desired material can be used according to the application. The nanoparticles 141 may contain one type of material, or may contain a plurality of materials according to the application. The value of the work function of the nanoparticles 141 may be, for example, between the value of the work function of the first electrode 11 and the value of the work function of the second electrode 12, or may be, for example, a value other than between the value of the work function of the first electrode 11 and the value of the work function of the second electrode 12, and may be selected as desired.

Examples of the material of the nanoparticles 141 include a metal. As the nanoparticles 141, for example, particles containing one type of material such as gold or silver, or particles of an alloy containing two or more types of materials may be used. As the material of the nanoparticles 141, at least one type of conductive material other than gold and silver may be selected.

The nanoparticles 141 contain a metal oxide. As the nanoparticles 141 containing the metal oxide, a metal oxide of at least one element selected from the group consisting of a metal and Si, such as, for example, zirconia ($ZrO_2$), titania ($TiO_2$), silica ($SiO_2$), alumina ($Al_2O_3$), iron oxide ($Fe_2O_3$ or $Fe_2O_5$), copper oxide (CuO), zinc oxide (ZnO), yttria ($Y_2O_3$), niobium oxide ($Nb_2O_5$), molybdenum oxide ($MoO_3$), indium oxide ($In_2O_3$), tin oxide ($SnO_2$), tantalum oxide ($Ta_2O_5$), tungsten oxide ($WO_3$), lead oxide (PbO), bismuth oxide ($Bi_2O_3$), ceria ($CeO_2$), and antimony oxide ($Sb_2O_5$, $Sb_2O_3$) is used.

The nanoparticles 141 contain a dielectric. As the nanoparticles 141 containing a dielectric, for example, a known material is used.

The nanoparticles 141 may contain a metal oxide other than a magnetic material. For example, when the nanoparticles 141 contain a metal oxide representing a magnetic material, the movement of the nanoparticles 141 may be restricted by a magnetic field caused by the environment in which the thermoelectric element 1 is installed. Thus, when the nanoparticles 141 contain a metal oxide other than a magnetic material, the nanoparticles 141 are not affected by the magnetic field caused by the external environment, which can help prevent a decrease in the power generation amount over time.

Each of the nanoparticles 141 includes a coating film 141a on the surface. The thickness of the coating film 141a is a finite value of, for example, 20 nm or less. By providing the coating film 141a on the surface of each nanoparticle 141, aggregation can be suppressed when the nanoparticles are dispersed in the insulating layer 142, for example. In addition, for example, electrons can be made more likely to move between the first electrode 11 and the nanoparticles 141, between the plurality of nanoparticles 141, and between the second electrode 12 and the nanoparticles 141 by hopping conduction or the like.

As the coating film 141a, for example, a material having a thiol group or a disulfide group is used. As the material having the thiol group, for example, alkanethiol such as dodecanethiol is used. As the material having the disulfide group, for example, alkane disulfide is used.

The insulating layer 142 is provided between the electrodes 11 and 12 and is in contact with the electrodes 11 and 12, for example. The thickness of the insulating layer 142 is a finite value of, for example, 500 μm or less. The thickness of the insulating layer 142 affects the value of the gap G and the variation in the gap G described above. Thus, when the thickness of the insulating layer 142 is 200 nm or less, for example, this may lead to a decrease in the power generation amount caused by the variation in the gap G in the plane along the second direction X and the third direction Y. When the thickness of the insulating layer 142 is larger than 1 μm, the electric field generated between the electrodes 11 and 12 may be weakened. Thus, the thickness of the insulating layer 142 is preferably larger than 200 nm and 1 μm or less.

The insulating layer 142 may contain one type of material, or may contain a plurality of materials according to the application. The insulating layer 142 may have a structure in which the insulating layer 142 includes a plurality of layers containing different materials and the layers are stacked. When the insulating layer 142 includes a plurality of layers, the nanoparticles 141 each containing different materials may be dispersed in each layer, for example.

The insulating layer 142 has insulating properties. The material used for the insulating layer 142 can be selected as appropriate as long as the material is an insulating material capable of fixing the nanoparticles 141 in a dispersed state, and an organic polymer compound is preferable. When the insulating layer 142 contains an organic polymer compound, the insulating layer 142 can be formed to be flexible. Thus, the thermoelectric element 1 having a shape such as a curved shape or a bent shape according to the application can be formed.

Examples of the organic polymer compound include polyimide, polyamide, polyester, polycarbonate, poly(meth) acrylate, a radical polymerization-based photosetting or thermosetting resin, a photocationic polymerization-based photosetting or thermosetting resin, an epoxy resin, a copolymer containing an acrylonitrile component, polyvinyl phenol, polyvinyl alcohol, polystyrene, a novolac resin, and polyvinylidene fluoride.

As the insulating layer 142, for example, an inorganic substance may be used. Examples of the inorganic substance include porous inorganic substances such as zeolite and diatomaceous earth, and cage-shaped molecules.

First Substrate 15 and Second Substrate 16

As illustrated in FIG. 1, for example, the first substrate 15 and the second substrate 16 are provided sandwiching the electrodes 11 and 12 and the intermediate portion 14 and are separated from each other in the first direction Z. For example, the first substrate 15 is in contact with the first electrode 11 and is separated from the second electrode 12. The first substrate 15 fixes the first electrode 11. The second substrate 16 is in contact with the second electrode 12 and is separated from the first electrode 11. The second substrate 16 fixes the second electrode 12.

The thickness of each of the substrates 15 and 16 along the first direction Z is, for example, 10 μm or more and 2 mm or less. The thickness of each of the substrates 15 and 16 can be set as desired. The shape of each of the substrates 15 and 16 may be, for example, a quadrangular shape such as a square or a rectangle, or a disk shape, or may be set as desired according to the application.

As each of the substrates 15 and 16, for example, a plate-shaped member having insulating properties can be used. For example, a known member such as silicon, quartz, or Pyrex (registered trademark) can be used. As each of the substrates 15 and 16, for example, a film-like member may be used. For example, a known film-like member such as polyethylene terephthalate (PET), polycarbonate (PC), or polyimide may be used.

As each of the substrates 15 and 16, for example, a member having conductivity can be used, and examples thereof include iron, aluminum, copper, and an alloy of aluminum and copper. As each of the substrates 15 and 16, a conductive polymer or a semiconductor having conductivity, such Si or GaN, may be used. When a member having conductivity is used for each of the substrates 15 and 16, wiring for connection to the electrodes 11 and 12, respectively, is not required.

Figure 3B:
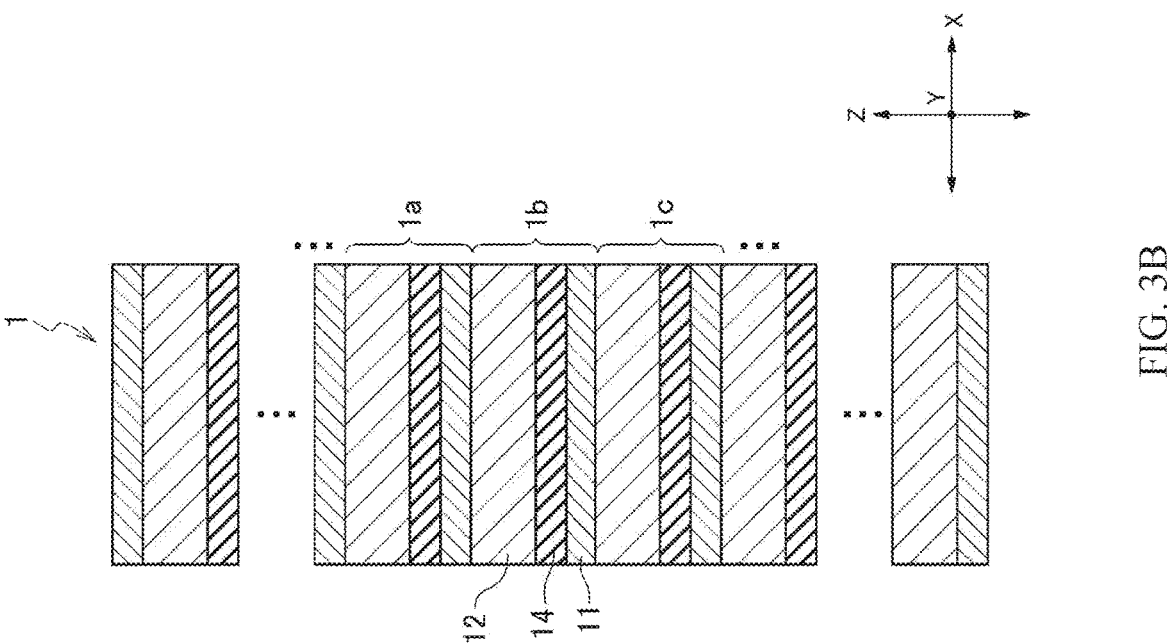
FIG. 3B is a schematic cross-sectional view illustrating a second variation of the thermoelectric element according to the first embodiment.
Figure 3A:
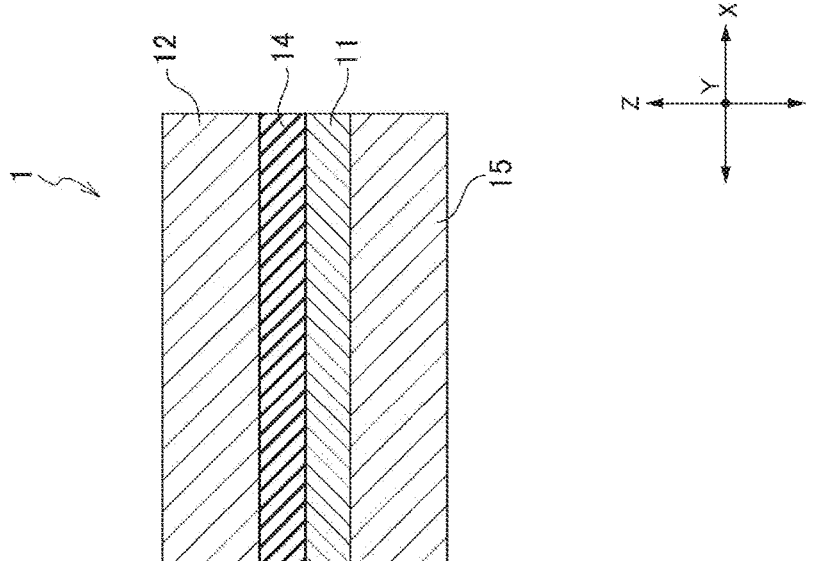
FIG. 3A is a schematic cross-sectional view illustrating a first variation of a thermoelectric element according to the first embodiment.

As illustrated in FIG. 3A, for example, the thermoelectric element 1 may include only the first substrate 15 or may include only the second substrate 16. As illustrated in FIG. 3B, for example, the thermoelectric element 1 may have a laminated structure (e.g., 1a, 1b, 1c, etc.) in which the first electrode 11, the intermediate portion 14, and the second electrode 12 are layered in this order without including the substrates 15 and 16, or may have a laminated structure including at least one of the substrates 15 and 16, for example.

Support Portion 13

Figure 4B:
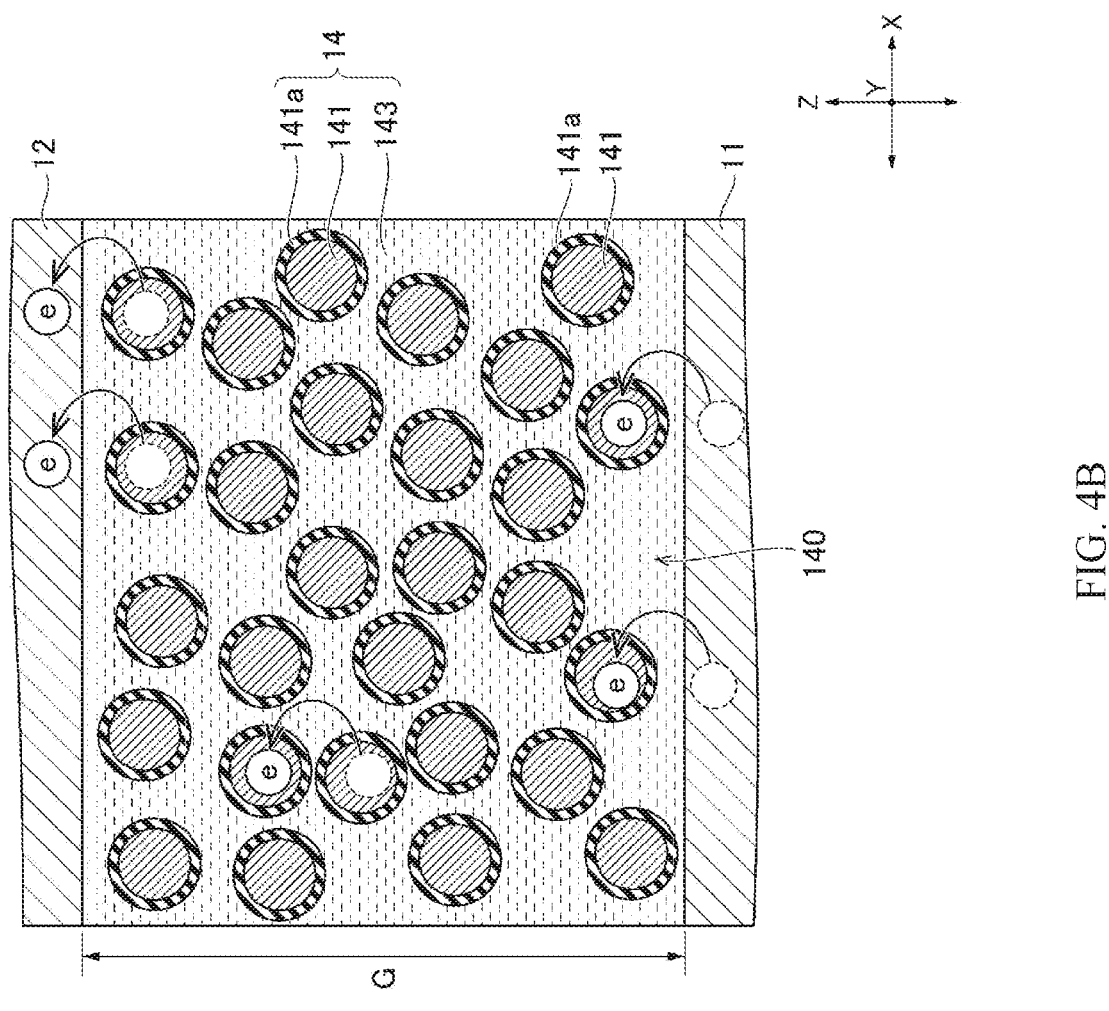
FIG. 4B is a schematic cross-sectional view illustrating an example of an intermediate portion of the thermoelectric element in FIG. 4A.
Figure 4A:
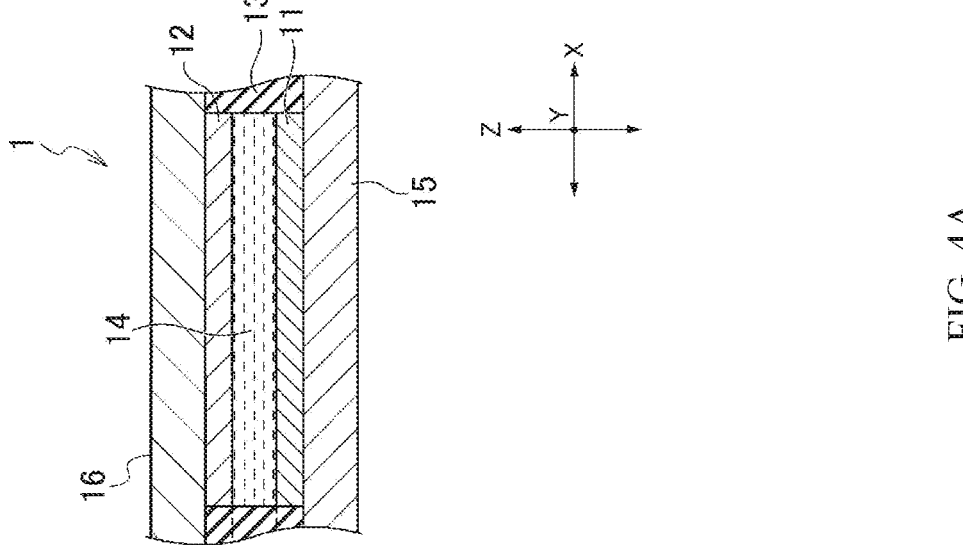
FIG. 4A is a schematic cross-sectional view illustrating a third variation of the thermoelectric element according to the first embodiment.

As illustrated in FIG. 4A, for example, the thermoelectric element 1 may further include a support portion 13. The support portion 13 is provided between and in contact with the first substrate 15 and the second substrate 16 which are a pair of substrates or the first electrode 11 and the second electrode 12 which are a pair of electrodes. The support portion 13 is in contact with the first electrode 11 and the second electrode 12 in the second direction X, for example, but may be separated from the first electrode 11 and the second electrode 12.

A material having insulating properties can be selected as the material of the support portion 13. Examples of the insulating material include silicon, a silicon oxide film, glass such as quartz, and an insulating resin. In addition to the above, the support portion 13 may have a flexible film shape, for example, and polyethylene terephthalate (PET), polycarbonate (PC), and polyimide can be used.

The intermediate portion 14 of the thermoelectric element 1 may contain a solvent 143 instead of the insulating layer 142. As illustrated in FIG. 4B, for example, in this case, the nanoparticles 141 are dispersed in the solvent 143. The intermediate portion 14 is formed by filling the space 140 with the solvent 143 in which the nanoparticles 141 are dispersed, for example.

As the solvent 143, for example, a liquid having a boiling point of 60° C. or higher can be used. With this configuration, even when the thermoelectric element 1 is used in an environment of room temperature (e.g., 15° C. to 35° C.) or higher, vaporization of the solvent 143 can be suppressed. As a result, deterioration of the thermoelectric element 1 due to vaporization of the solvent 143 can be suppressed. As an example of the liquid, at least one of an organic solvent and water can be selected. Examples of the organic solvent include methanol, ethanol, toluene, xylene, tetradecane, and alkanethiol. Note that the solvent 143 is preferably an insulating liquid having a high electric resistance value.

Operation Example of Thermoelectric Element 1

When thermal energy is applied to the thermoelectric element 1, for example, electrons move between the first electrode 11 and the second electrode 12, and thermal energy is converted into electrical energy. The number of electrons moving between the first electrode 11 and the second electrode 12 depends not only on the thermal energy but also on a difference between the work function of the second electrode 12 and the work function of the first electrode 11.

The number of electrons moving between the first electrode 11 and the second electrode 12 can be increased by, for example, increasing a work function difference between the first electrode 11 and the second electrode 12 and by decreasing the gap G. For example, the amount of electrical energy generated by the thermoelectric element 1 can be increased by considering at least one of increasing the work function difference and decreasing the gap G. Further, the number of electrons moving between the electrodes 11 and 12 can be increased by providing the nanoparticles 141 between the electrodes 11 and 12, which can lead to an increase in the amount of electric current.

The term "work function" refers to the minimum energy required to extract electrons present in a solid into a vacuum. The work function can be measured by ultraviolet photoelectron spectroscopy (UPS), X-ray photoelectron spectroscopy (XPS), or Auger electron spectroscopy (AES), for example.

According to the present embodiment, the thermoelectric element 1 is provided in contact with the heat storage portion 65 and is covered by the insulating portion 63. Thus, the heat generated from the heat storage portion 65 can be easily transferred to the thermoelectric element 1. As a result, the power generation amount of the thermoelectric element 1 can be increased.

According to the present embodiment, the heat storage portion 65 includes the sensible heat storage material. Thus, as compared with a latent heat storage material, the temperature range during use can be widened. With this configuration, energy harvesting suited to various applications is possible.

According to the present embodiment, the specific heat of the heat storage portion 65 is larger than the specific heat of the insulating portion 63. Thus, a state can be maintained in which the heat generated from the heat storage portion 65 is not easily released to the outside via the insulating portion 63. As a result, the power generation amount of the thermoelectric element 1 can be further increased.

Second Embodiment: Energy Harvesting Device 7

Figure 5:
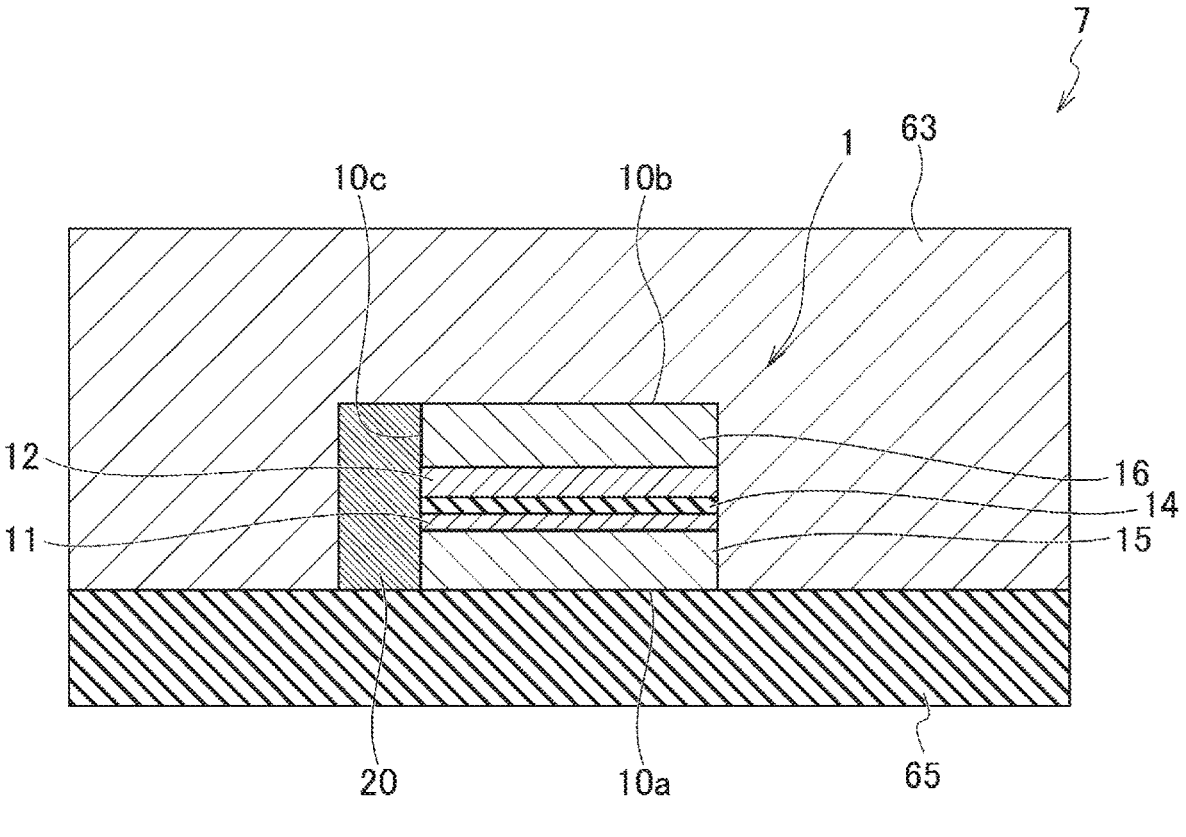
FIG. 5 is a schematic perspective view illustrating an example of an energy harvesting device according to a second embodiment.
Figure 5:
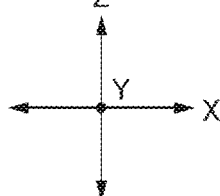

Next, another embodiment will be described. Detailed description of configurations similar to those of the above-described embodiment will be omitted below. FIG. 5 is a schematic cross-sectional view illustrating an example of an energy harvesting device 7 according to a second embodiment. The energy harvesting device 7 according to the second embodiment further includes a heat conduction portion 20.

The heat conduction portion 20 is in contact with the heat storage portion 65 and the thermoelectric element 1. The heat conduction portion 20 is covered by the insulating portion 63.

Heat transferred from the heat storage portion 65 to the thermoelectric element 1 includes heat transferred via the heat conduction portion 20 in addition to heat directly transferred from the heat storage portion 65. Thus, a contact area between the heat conduction portion 20 and the thermoelectric element 1 affects the amount of heat transferred to the thermoelectric element 1. Thus, the contact area between the heat conduction portion 20 and the thermoelectric element 1 is desirably large to increase the power generation amount of the thermoelectric element 1. For example, when the length of the heat conduction portion 20 is the length of the thermoelectric element 1 or more along the third direction Y, the contact area is larger than the contact area when the length of the heat conduction portion 20 is less than the length of the thermoelectric element 1. As a result, the amount of heat transferred to the thermoelectric element 1 can be increased, and the power generation amount of the thermoelectric element 1 can be increased.

The thermal conductivity of the heat conduction portion 20 may be higher than the thermal conductivity of the substrates 15 and 16. For example, when the material of the substrates 15 and 16 is stainless steel (SUS), a material having a relatively higher thermal conductivity than the substrates 15 and 16 may be used for the heat conduction portion 20. For example, copper having a higher thermal conductivity than the substrates 15 and 16 is used for the heat conduction portion 20. As a result, the heat transferred to the thermoelectric element 1 is less likely to be released to the outside, and the power generation amount of the thermoelectric element 1 can be increased.

Although not illustrated, when the thermoelectric element 1 includes the support portion 13, the thermal conductivity of the heat conduction portion 20 may be higher than the thermal conductivity of the support portion 13 to make it difficult for the heat transferred from the solar cell panel 6 to the thermoelectric element 1 to be released to the outside. The thermal conductivity of the heat conduction portion 20 may be higher than the thermal conductivity of at least one of the pair of the first electrode 11 and the second electrode 12.

The heat conduction portion 20 has conductivity and is made of, for example, a metal material. The heat conduction portion 20 is not limited to a metal material and may be made of any material as long as the material has high conductivity. The material having high conductivity desirably has thermal conductivity of 10 W/(m·k) or more measured in accordance with ASTM E1530. As the material having high conductivity, for example, a metal material such as gold, silver, copper, or aluminum may be used, and the material is preferably made of copper or aluminum.

In particular, according to the present embodiment, the heat conduction portion 20 is in contact with the heat storage portion 65 and the thermoelectric element 1 and is covered by the insulating portion 63. Thus, the heat generated from the heat storage portion 65 can be easily transferred to the thermoelectric element 1 via the heat conduction portion 20. As a result, the power generation amount of the thermoelectric element 1 can be further increased.

Third Embodiment: Energy Harvesting Device 7

FIG. 6 is a schematic cross-sectional view illustrating an example of an energy harvesting device 7 according to a third embodiment. The energy harvesting device 7 according to the third embodiment further includes a solar cell panel 6.

The energy harvesting device 7 converts light energy and thermal energy into electrical energy. The energy harvesting device 7 includes the solar cell panel 6 that converts light energy into electrical energy, and the thermoelectric element 1 that eliminates a temperature difference between electrodes when converting thermal energy into electrical energy.

The energy harvesting device 7 is provided, for example, on the ground or on a roof of a building, or in a site of a power generation facility. The energy harvesting device 7 is connected to an information processing device 75 to be described later, for example. The energy harvesting device 7 is connected to a known device such as a power conditioner (power conditioning system (PCS)), or a battery via, for example, wiring (not illustrated). The energy harvesting device 7 outputs power to a load via the power conditioner or the like. The load is, for example, an electrical device. The load is driven by, for example, using the energy harvesting device 7 as a main power supply or an auxiliary power supply.

Solar Cell Panel 6

The solar cell panel 6 converts light energy such as indoor light or solar light into electrical energy. As illustrated in FIG. 6, the solar cell panel 6 includes a plurality of solar cells 61, a support portion 62 provided on a back surface 61a side of the plurality of solar cells 61, and a sealant 64 in contact with the support portion 62. The solar cell panel 6 may include a known configuration such as a protective glass or a frame (not illustrated). Here, a surface of the solar cell panel 6 on a side irradiated with light such as solar light is referred to as a front surface, and a surface opposite to the front surface is referred to as a back surface 6a (that is, a back surface of the support portion 62).

Solar Cell 61

The solar cell 61 is a device that absorbs light energy such as solar light and converts the light energy into electrical energy. For example, a semiconductor made of silicon is used for the solar cell 61. A plurality of the solar cells 61 are provided separated from each other on a surface that absorbs light energy, for example. For example, when viewed from a direction from the solar cell 61 toward the support portion 62, an area of the solar cells 61 is larger than an area of the thermoelectric element 1.

Support Portion 62

The support portion 62 is a back sheet that supports the solar cells 61 from the back surface 61*a* side. The support portion 62 reflects light energy and protects the solar cells 61 from wind and rain, and the high heat and ultraviolet rays of solar light. As the support portion 62, for example, a known back sheet made of a plastic material is used.

Sealant 64

As the sealant 64, a known sealing material such as ethylene vinyl acetate copolymer resin (EVA) is used. The sealant 64 is provided between the solar cell 61 and the support portion 62.

The thermoelectric element 1 is sandwiched between the back surface 6*a* of the solar cell panel 6 and the heat storage portion 65. The side surface 10*c* of the thermoelectric element 1 is covered by the insulating portion 63. The thermoelectric element 1 converts, for example, thermal energy absorbed by the solar cell panel 6 into electrical energy to generate an electric current. The thermoelectric element 1 is connected to the solar cell panel 6 via wiring (not illustrated) in a parallel circuit, for example. The thermoelectric element 1 may be connected to the solar cell panel 6 via wiring (not illustrated) in a series circuit, for example.

In particular, according to the present embodiment, the thermoelectric element 1 is sandwiched between the back surface 6*a* of the solar cell panel 6 and the heat storage portion 65. Thus, the heat generated from the solar cell panel 6 in addition to the heat storage portion 65 can be transferred to the thermoelectric element 1. As a result, the power generation amount of the thermoelectric element 1 can be further increased.

The first main surface 10*a* and the second main surface 10*b* of the thermoelectric element 1 are provided along the back surface 61*a* of the solar cell 61. In this case, a contact area between the thermoelectric element 1 and the solar cell 61 can be increased. As a result, heat transferred from the solar cell 61 to the thermoelectric element 1 increases, and the power generation amount of the thermoelectric element 1 can be increased. Although not illustrated, the first main surface 10*a* and the second main surface 10*b* of the thermoelectric element 1 may be provided perpendicular to the back surface 61*a* of the solar cell 61. In this case, heat transferred from the solar cell 61 to each of the first electrode 11 and the second electrode 12 increases as compared with a case where one of the first electrode 11 and the second electrode 12 is separated from the solar cell 61. As a result, the power generation amount in the thermoelectric element 1 can be increased.

Fourth Embodiment: Energy Harvesting Device 7

Figure 7:
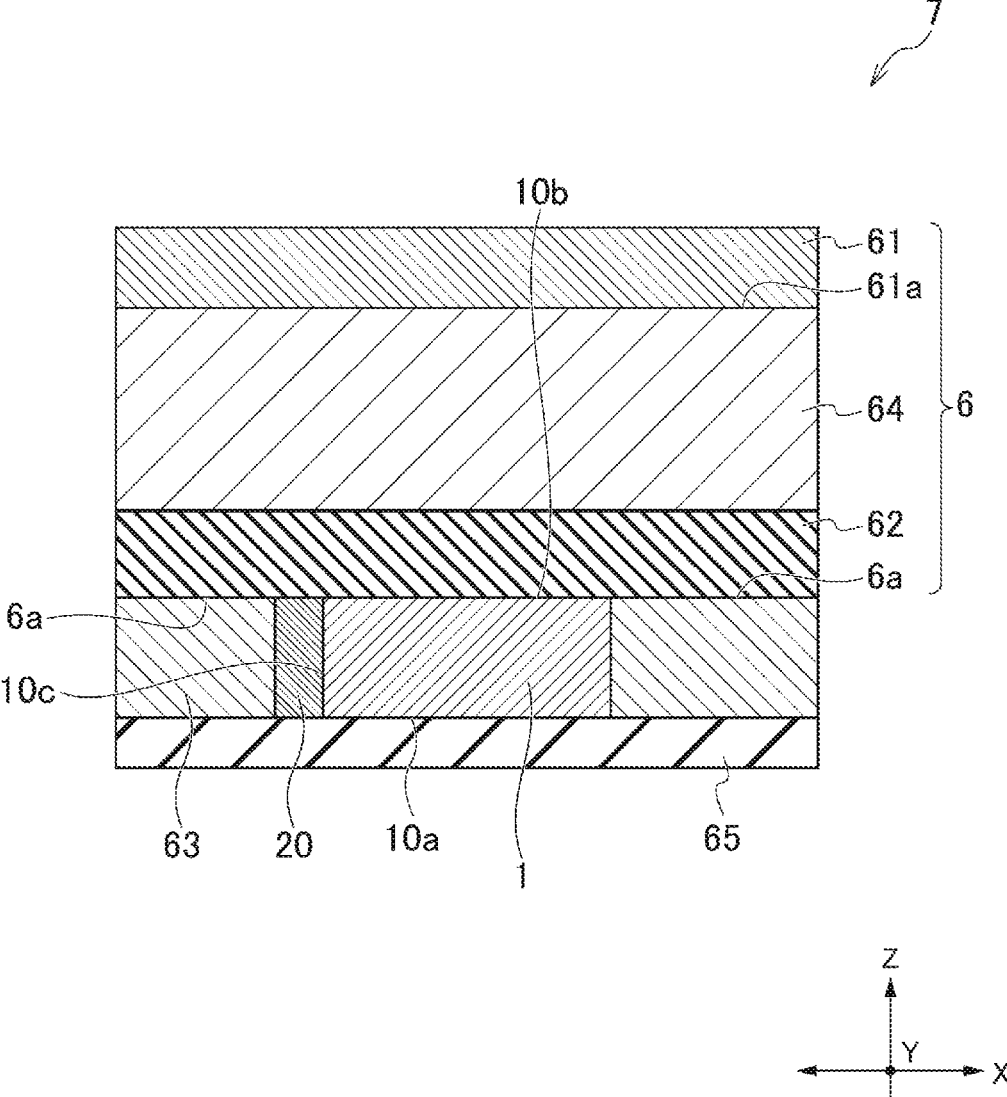
FIG. 7 is a schematic cross-sectional view illustrating an example of an energy harvesting device according to a fourth embodiment.

FIG. 7 is a schematic cross-sectional view illustrating an example of an energy harvesting device 7 according to a fourth embodiment. The energy harvesting device 7 according to the fourth embodiment further includes the heat conduction portion 20 and the solar cell panel 6.

The heat conduction portion 20 is provided in contact with the solar cell panel 6, the heat storage portion 65, and the thermoelectric element 1. The side surface 10*c* of the heat conduction portion 20 is covered by the insulating portion 63. The heat conduction portion 20 is sandwiched between the back surface 6*a* of the solar cell panel 6 and the heat storage portion 65.

In particular, according to the present embodiment, the heat conduction portion 20 is provided in contact with the solar cell panel 6, the heat storage portion 65, and the thermoelectric element 1. Thus, the heat generated from the solar cell panel 6 can be easily transferred to the heat storage portion 65 and the thermoelectric element 1. In addition, the heat generated from the heat storage portion 65 can be easily transferred to the thermoelectric element 1 via the heat conduction portion 20. As a result, the power generation amount of the thermoelectric element 1 can be further increased.

Fifth Embodiment: Energy Harvesting System 700

Figure 8:
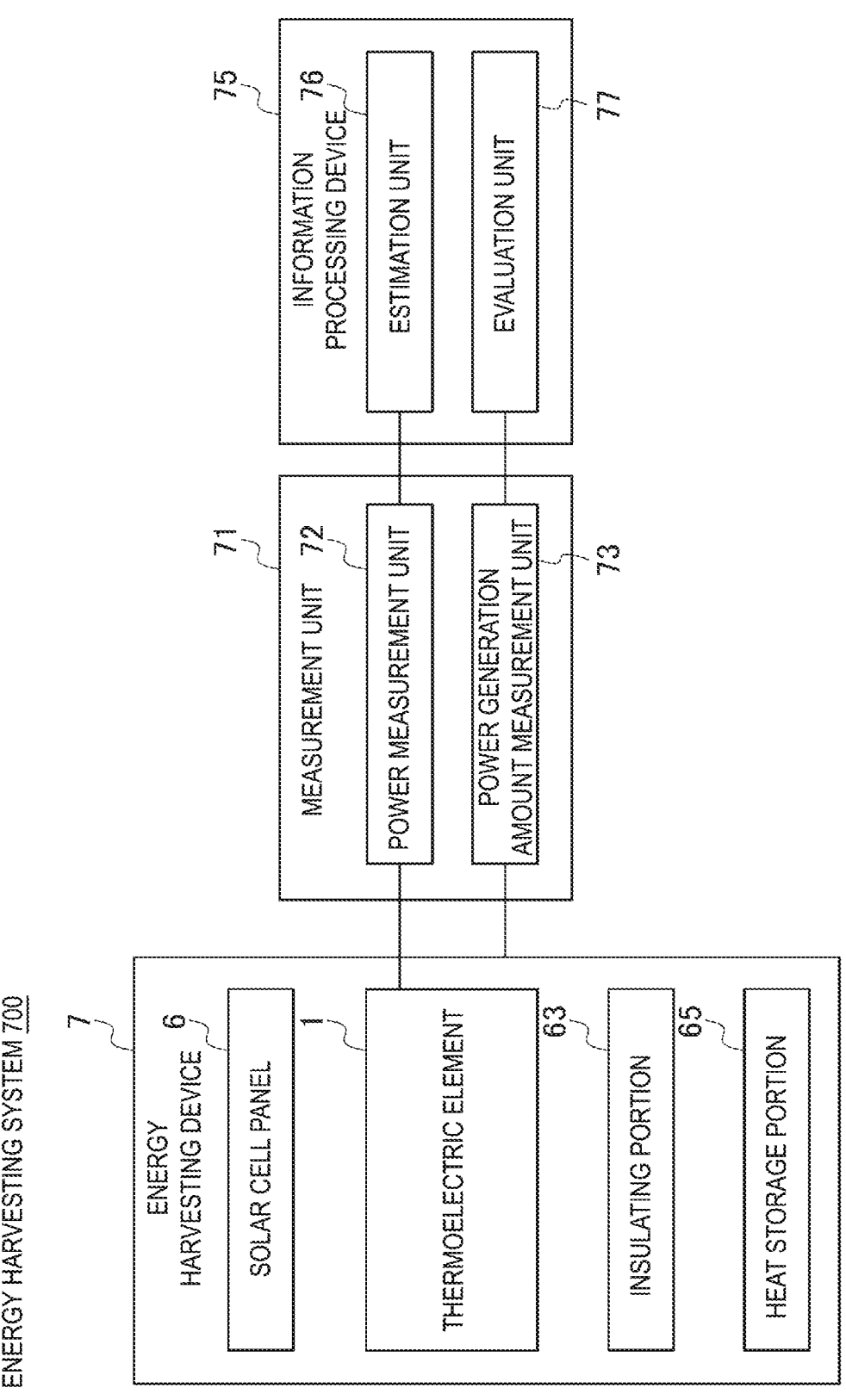
FIG. 8 is a schematic cross-sectional view illustrating an example of an energy harvesting system according to a fifth embodiment.

FIG. 8 is a schematic view illustrating an example of an energy harvesting system 700 according to a fifth embodiment. The energy harvesting system 700 includes the energy harvesting device 7, a measurement unit 71, and an information processing device 75. The energy harvesting device 7 converts light energy and thermal energy into electrical energy. The energy harvesting device 7 includes the solar cell panel 6 that converts light energy into electrical energy, and the thermoelectric element 1 that eliminates a temperature difference between electrodes when converting thermal energy into electrical energy.

Measurement Unit 71

The measurement unit 71 includes a power measurement unit 72 and a power generation amount measurement unit 73.

Power Measurement Unit 72

The power measurement unit 72 measures power of the thermoelectric element 1. As the power measurement unit 72, a known unit for measuring power is used.

Power Generation Amount Measurement Unit 73

The power generation amount measurement unit 73 measures the power generation amounts of the thermoelectric element 1 and the solar cell panel 6. As the power generation amount measurement unit 73, a known unit for measuring the power generation amount is used.

Information Processing Device 75

The information processing device 75 is installed in a power plant, for example, and functions as a control unit in the power plant. As the information processing device 75, for example, a personal computer is used. The information processing device 75 includes an estimation unit 76 and an evaluation unit 77. The information processing device 75 may further include an input/output unit that inputs and outputs various types of information and a storage unit that stores various types of information.

Figure 9:
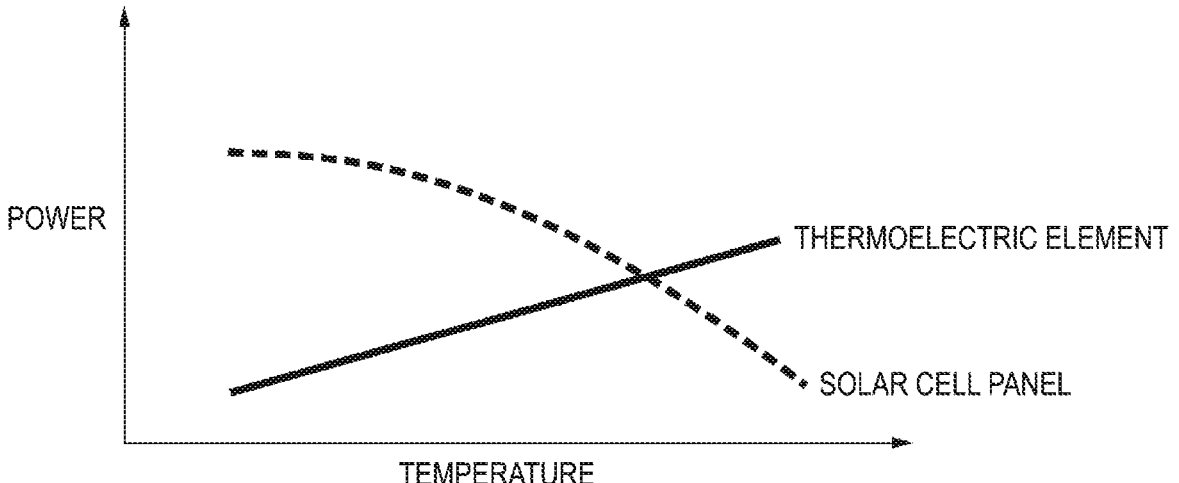
FIG. 9 is a diagram showing an example of a relationship between temperature and power for a solar cell panel and a thermoelectric element.

FIG. 9 is a diagram showing an example of a relationship between temperature and power for the solar cell panel 6 and the thermoelectric element 1. As shown in FIG. 9, when the temperature of the solar cell panel 6 increases, the power generated from the solar cell panel 6 tends to decrease. Further, when the temperature of the thermoelectric element 1 increases, the power generated from the thermoelectric element 1 tends to increase. In the information processing device 75, for example, relationships between temperature and power may be stored in advance for the solar cell panel 6 and the thermoelectric element 1.

Further, in the information processing device 75, for example, a relationship between the power generation amount of the thermoelectric element 1 and the temperature of the solar cell 61 may be stored in advance. Further, in the information processing device 75, for example, a relationship between the power of the thermoelectric element 1 and the temperature of the solar cell 61 may be stored in advance.

Estimation Unit 76

The estimation unit 76 refers to, for example, the relationships between the temperature and the power for the solar cell panel 6 and the thermoelectric element 1 stored in the information processing device 75, and estimates the power generated from the solar cell 61 based on the measurement result of the power measurement unit 72. That is, the tendency of the power that varies depending on the temperature of the solar cell panel 6 can be easily estimated. Thus, for example, generation of excessive power from the solar cell panel 6 due to a decrease in the outside air temperature can be known in advance, and the solar cell panel 6 can be controlled. As a result, the power generation amount of the entire energy harvesting device 7 can be further increased.

Evaluation Unit 77

The evaluation unit 77 refers to, for example, the relationship between the power of the thermoelectric element 1 and the temperature of the solar cell 61 stored in the information processing device 75, and evaluates the temperature of the solar cell 61 based on the measurement result of the power measurement unit 72. The evaluation unit 77 refers to, for example, the relationship between the power generation amount of the thermoelectric element 1 and the temperature of the solar cell 61 stored in the information processing device 75, and evaluates the temperature of the solar cell 61 based on the measurement result of the power generation amount measurement unit 73.

In particular, according to the present embodiment, the power generation amount measurement unit 73 measures the power generation amounts of the thermoelectric element 1 and the solar cell panel 6. Thus, the instability of the power generation amount in the solar cell panel 6 can be compensated by the power generation amount of the thermoelectric element 1. As a result, a variation in the power generation amount over time can be suppressed.

In particular, according to the present embodiment, the estimation unit 76 estimates the power generated from the solar cell based on the measurement result of the power measurement unit 72. Thus, a variation in the power generation amount caused by the temperature of the solar cell panel can be easily estimated. As a result, the power generation amount of the entire energy harvesting device 7 can be further increased.

While certain embodiments have been described, these embodiments have been presented by way of example only, and are not intended to limit the scope of the invention. The novel embodiments described herein may be embodied in a variety of other forms, and various omissions, substitutions and changes may be made without departing from the spirit of the invention. These embodiments and variations are included in the scope and gist of the invention, and are included in the invention described in the claims and the scope equivalent thereto.

REFERENCE SIGNS LIST

1 Thermoelectric element
10a First main surface
10b Second main surface
10c Side surface
11 First electrode
12 Second electrode
13 Support portion

16

14 Intermediate portion
140 Space
141 Nanoparticle
141a Coating film
142 Insulating layer
143 Solvent
15 First substrate
16 Second substrate
20 Heat conduction portion
6 Solar cell panel
6a Back surface
61 Solar cell
61a Back surface
62 Support portion
63 Insulating portion
64 Sealant
65 Heat storage portion
66 Protection portion
7 Energy harvesting device
71 Measurement unit
72 Power measurement unit
73 Power generation amount measurement unit
75 Information processing device
76 Estimation unit
77 Evaluation unit
700 Energy harvesting system
Z First direction
X Second direction
Y Third direction

The invention claimed is:

1. An energy harvesting device configured to convert thermal energy into electrical energy, comprising:
   a heat storage portion having an insulating property and configured to store thermal energy;
   a thermoelectric element:
      disposed on the heat storage portion in an upward direction of the energy harvesting device,
      including:
         a first electrode;
         a second electrode, having a work function different from a work function of the first electrode, disposed above the first electrode in the upward direction; and
         an intermediate portion disposed between the first electrode and the second electrode, and
      configured to eliminate a temperature difference between the first electrode and the second electrode when converting thermal energy into electrical energy; and
   an insulating portion disposed on the heat storage portion in the upward direction and covering the thermoelectric element to contact an upper surface of the thermoelectric element and side walls of the thermoelectric element, wherein
   the intermediate portion includes a solid insulating layer in which nanoparticles are fixed in a dispersed state.

2. The energy harvesting device according to claim 1, further comprising:
   a heat conduction portion disposed on the heat storage portion in the upward direction and between one of the side walls and the insulating portion in a direction perpendicular to the upward direction to contact the one of the side walls and the insulating portion.

3. The energy harvesting device according to claim 1, wherein the heat storage portion includes a sensible heat storage material.

4. The energy harvesting device according to claim 3, wherein the heat storage portion includes an aerogel.

5. The energy harvesting device according to claim 1, wherein a specific heat of the heat storage portion is larger than a specific heat of the insulating portion.

6. The energy harvesting device according to claim 1, further comprising:

a solar cell panel configured to convert light energy into electrical energy, wherein the thermoelectric element is sandwiched between a back surface of the solar cell panel and the heat storage portion.

7. The energy harvesting device according to claim 6, further comprising:

a heat conduction portion provided in contact with the solar cell panel, the heat storage portion, and the thermoelectric element.

8. An energy harvesting system comprising:

the energy harvesting device according to claim 1;

a solar cell panel configured to convert light energy into electrical energy; and a power generation amount measurement unit configured to measure power generation amounts of the thermoelectric element and the solar cell panel.

9. The energy harvesting system according to claim 8, further comprising:

a power measurement unit configured to measure power of the thermoelectric element, and an estimation unit configured to estimate power generated from the solar cell panel based on a measurement result of the power measurement unit.

\* \* \* \* \*